United States Patent
Umehara et al.

(10) Patent No.: US 7,709,983 B2
(45) Date of Patent: May 4, 2010

(54) VIBRATION MOTOR HOLDING STRUCTURE AND VIBRATION MOTOR

(75) Inventors: Mikio Umehara, Tottori-ken (JP); Kazuaki Sato, Tottori-ken (JP); Daichi Kadowaki, Tottori-ken (JP)

(73) Assignee: Minebea Motor Manufacturing Corporation, Tokyo (JP)

( * ) Notice: Subject to any disclaimer, the term of this patent is extended or adjusted under 35 U.S.C. 154(b) by 0 days.

(21) Appl. No.: 12/151,056

(22) Filed: May 2, 2008

(65) Prior Publication Data

US 2009/0051238 A1  Feb. 26, 2009

(30) Foreign Application Priority Data

May 24, 2007  (JP)  ............... 2007-137987

(51) Int. Cl.
*H02K 7/06* (2006.01)
*H02K 5/00* (2006.01)

(52) U.S. Cl. .................................... 310/81; 310/91
(58) Field of Classification Search ............ 310/81, 310/91
See application file for complete search history.

(56) References Cited

U.S. PATENT DOCUMENTS 6,081,055 A  6/2000  Narusawa
7,023,114 B2  4/2006  Takagi et al.
2008/0309180 A1*  12/2008  Suzuki et al. ............. 310/81

FOREIGN PATENT DOCUMENTS

| JP | 06-189486 | 7/1994 |
| JP | 11-234943 | 8/1999 |
| JP | 2005-198366 | 7/2005 |
| JP | 2005-312282 | 11/2005 |
| JP | 2006-25555 | 1/2006 |
| JP | 2006-304491 | 11/2006 |
| WO | WO 2006016518 A1 * | 2/2006 |

\* cited by examiner

*Primary Examiner*—Quyen Leung
*Assistant Examiner*—Jose A Gonzalez Quinones
(74) *Attorney, Agent, or Firm*—McDermott Will & Emery LLP (57) ABSTRACT

In a vibration motor holding structure for retaining a vibration motor having eccentric weights at rotation shaft ends and holding the vibration motor on a circuit board, there is provided a metal holder having support legs provided along a part of the length of the vibration motor and protruding horizontally in the direction orthogonal to the longitudinal direction of the vibration motor on both sides thereof. Thus, the vibration motor can be prevented from falling over during the mounting process and be held on the circuit board at solder-applied positions.

4 Claims, 12 Drawing Sheets

VIBRATION MOTOR HOLDING STRUCTURE AND VIBRATION MOTOR

CROSS-REFERENCE TO RELATED APPLICATIONS

This application claims priority to Japanese Patent Application No. 2007-137987, filed May 24, 2007, which is expressly incorporated herein by reference and made a part hereof.

FEDERALLY SPONSORED RESEARCH OR DEVELOPMENT

Not Applicable.

TECHNICAL FIELD

The present invention relates to a holding structure for vibration motors used in portable communication devices such as cellular phones and PHSs and game machines for body sensory features and a vibration motor provided with the holding structure.

BACKGROUND OF THE INVENTION

Portable communication devices inform the wearer of an incoming call by ring tones or body sensory vibrations generated by the rotation of eccentric weights of a built-in vibration motor. These modes are switched as necessary. Some game machines let the operator sense vibrations generated by the vibration motor in the machine in the course of games for more fun.

The above vibration motor is secured to a circuit board in the device/machine and generates and transmits vibrations to the device/machine housing, whereby the wearer/operator senses the vibrations. Such an example is described in Japanese Patent Application Laid-open No. H11-234943, wherein a vibration motor is mounted on a circuit board in such a manner that a cylindrical motor body is retained by a metal holder frame from below, a half-moon-shaped eccentric weight is fixed to one end of a motor shaft, creamed solder applied to the holder bottom is melted in a heating furnace to secure the entire structure to the circuit board.

The vibration motor is mounted in an automated process in which the motor body having an eccentric weight is retained in a holder frame to make a vibration motor unit, which is placed on a circuit board at a predetermined position, conveyer-transferred, heated in a heating furnace to melt the solder on the circuit board, and cooled to solidify the melted solder to secure the holder frame to the circuit board.

The vibration motor unit retained in the holder frame is simply placed on a circuit board while conveyer-transferred and, therefore, fairly unstable. Slight external vibration or extraordinary movement of the conveyer may cause the unit to fall over. If one of a plurality of vibration motor units placed on circuit boards transferred in a line falls over, the entire conveyer has to be once stopped to raise the vibration motor unit fell before the mounting process resumes. The transfer should be monitored and the work performance is significantly low.

SUMMARY OF THE INVENTION

The present invention has been made in light of the above problem and it is an object of the present invention to provide a vibration motor holding structure preventing a vibration motor unit from falling over during the process of mounting on a circuit board and a vibration motor held on the circuit board by the holding structure.

In order to achieve the above object, there is provided a vibration motor holding structure for retaining a vibration motor having eccentric weights at rotation shaft ends and holding the vibration motor on a circuit board, the vibration motor holding structure comprises a metal holder having support legs provided along a part of the length of the vibration motor and protruding horizontally in the direction orthogonal to the longitudinal direction of the vibration motor on either side thereof and placed on the circuit board at solder-applied positions.

Alternatively, the holding structure comprises a metal holder having a substantially U shaped opening at the bottom for retaining a vibration motor body from the top to both sides, being constricted at the open bottom, and having a support leg continued from the constricted part along a part of the length of the vibration motor and protruding horizontally in the direction orthogonal to the longitudinal direction of the vibration motor on both sides thereof.

It is preferable that the support leg is provided to the vibration motor along a part of the length of the vibration motor, not along the entire length thereof. The support leg can be formed by an extended section of the part retaining one side of the vibration motor body. The support leg can be formed by overlapping the extended section for enhanced strength.

The vibration motor of the present invention is held on a circuit board with the above described support legs of the holding structure being fixed to the circuit board by reflow soldering.

In the present invention, the holding structure for holding a vibration motor on a circuit board has a metal holder having support legs at the bottom, and the support legs are provided along a part of the length of the motor and protruded in the direction orthogonal to the longitudinal direction of the motor, whereby the vibration motor unit does not easily fall over when it is subject to slight external vibration or extraordinary movement of the transfer means while placed on the circuit board and transferred. Therefore, there is no need of monitoring the transfer and the loss in work performance in association with the stop and resume of the operation because of the fall over is prevented.

The support legs are provided along a part of the length of the vibration motor. Therefore, the area of the protruding part is significantly reduced compared with the area with which the prior art motor holder frame makes contact with the circuit board. The influence on wiring pattern design on the circuit board is small, increasing the degree of freedom of pattern design and allowing the circuit board area to be reduced.

BRIEF DESCRIPTION OF THE DRAWINGS

The above object and other advantages of the present invention will become apparent by describing in detail the preferred embodiment of the present invention with reference to the attached drawings in which.

DETAILED DESCRIPTION

Preferred Embodiments will now be described hereafter with reference to the drawings.

First Embodiment

FIGS. 1 to 6 are exploded perspective views of a vibration motor provided with a holding structure according to one embodiment of the present invention.

Figure 1:
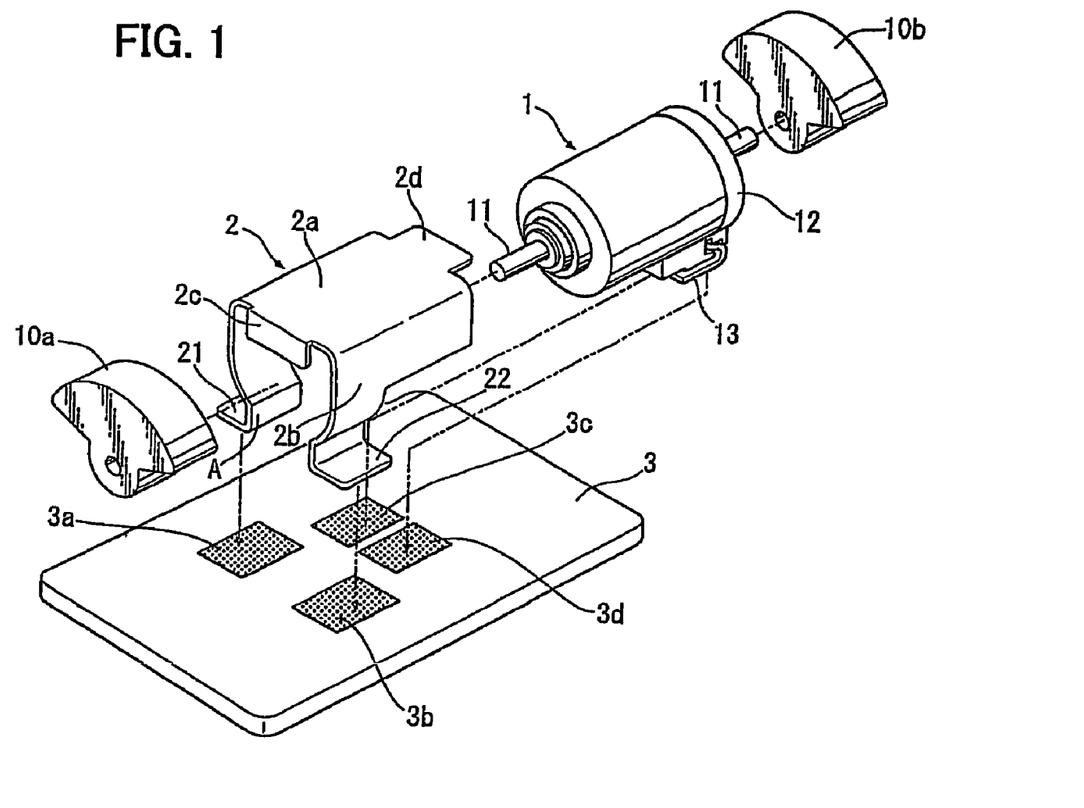
FIG. 1 is a perspective view of a holding structure for explaining the mounting of a vibration motor on a circuit board according to a first embodiment of the present invention.

FIG. 1 shows a cylindrical vibration motor body 1 of vibration motor eccentric weights 10a and 10b fixed to a motor rotation shaft 11 at both ends of the vibration motor body 1 for generating vibrations, a metal holder 2 fitting on the vibration motor body 1 from above to retain it, and a circuit board 3 on which the vibration motor is mounted.

A resin bracket 12 is fastened to the vibration motor body 1 at the rear end (at the back on the right in the figure). Conductive external terminals 13 are attached to the bracket 12 and fixed brush terminals of the vibration motor body 1 are electrically connected to the external terminals 13.

Figure 2:
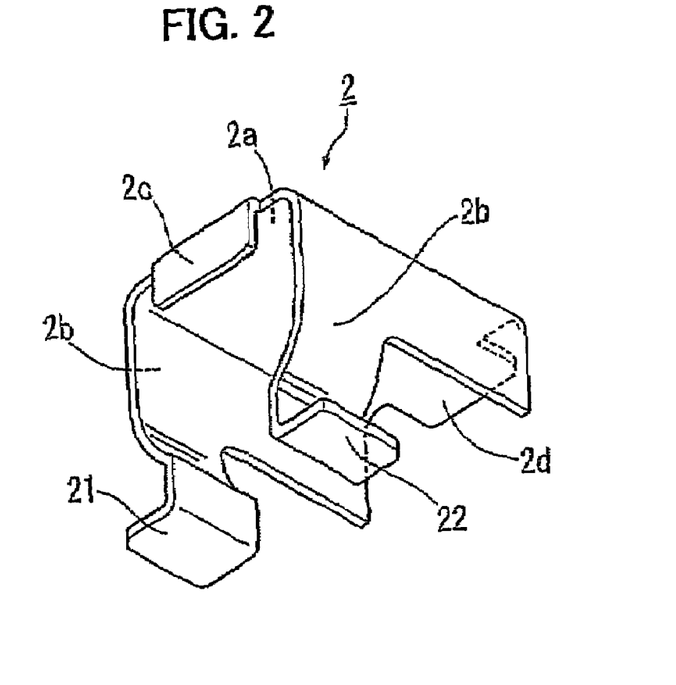
FIG. 2 is a perspective view of a holder shown in FIG. 1.

The holder 2 has a U-shape having a flat part 2a making contact with the top of the vibration motor body 1 and side walls 2b continued from the flat part 2a in the front part in the longitudinal direction to make contact with both peripheral sides of the vibration motor body 1, the U-shape being gently curved toward the bottom and then constricted (marked by A in the figure). The constricted part A is followed by support legs 21 and 22 protruding horizontally in the direction orthogonal to the axis of the motor. The holder 2 also has a motor retention piece 2c bent downward from the flat part 2a at one longitudinal end (at the front) and a motor retention piece 2d provided horizontally from the flat part 2a at the other end. FIG. 2 is a perspective view of the holder 2 seen from diagonally below.

Figure 3:
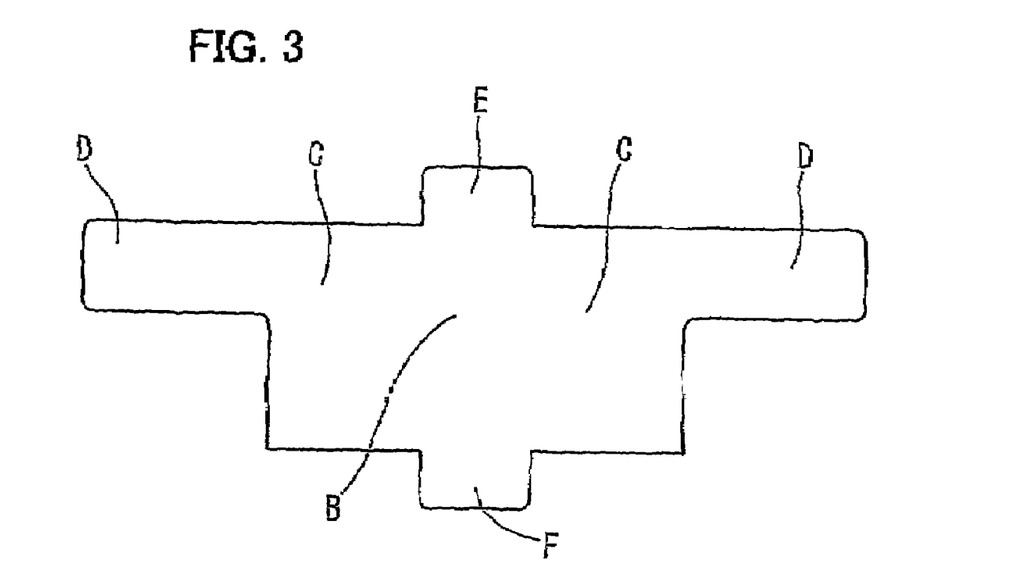
FIG. 3 is a plan view of the holder material.

The holder 2 is formed by pressing a steel plate (such as a rolled carbon steel plate SPCC) having a thickness of 0.1 mm to 0.3 mm and plated for a good affinity to solder into a shape shown in FIG. 3, which is folded by a processing machine (not shown) to create a three-dimensional shape shown in FIG. 2. The holder material shown in FIG. 3 has a center part B to form the flat part 2a of the holder 2, right and left parts C to form the side walls 2b, right and left ends D to form the support legs 21 and 22, a top projection E to be bent to form the motor retention piece 2c, and another projection F to form the motor retention piece 2d.

Holder materials having tin-based plating are advantageous in cost. However, gold-plating is preferable where soldering property has a priority. When the holder material is nickel silver, no plating is required because it has a good affinity to solder.

Referring back to FIG. 1, the circuit board 3 carries a desired printed circuit (not shown) and creamed solder layers 3a, 3b, 3c, and 3d applied at specific positions where no wiring for the printed circuit is provided. The positions of the creamed solder layers 3a and 3b correspond to the positions of the support legs 21 and 22. The positions of the creamed solder layers 3c and 3d correspond to the positions of the external terminals 13.

Figure 4:
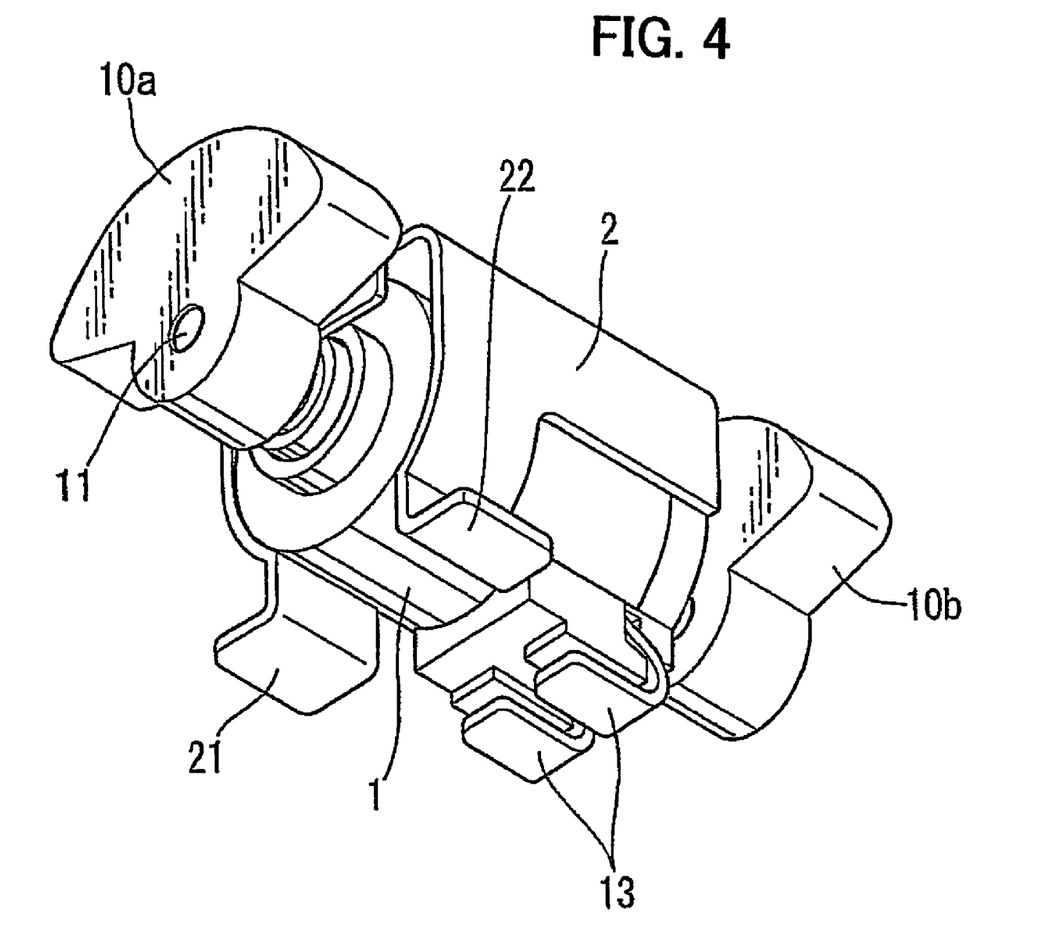
FIG. 4 is a perspective view of a vibration motor unit fabricated according to the first embodiment.

Mounting procedure of the vibration motor unit of the present invention on the circuit board will now be described hereafter with reference to FIGS. 4, 5 and 6.

The cylindrical vibration motor body 1 is fitted in the holder 2 previously folded into the three-dimensional shape shown in FIG. 2 from the back on the right until the leading end of the vibration motor body 1 abuts against the motor retention piece 2c in the front of the holder 2. Then, the other motor retention piece 2d on the other end is bent downward. Consequently, the vibration motor body 1 is enclosed in the holder 2 by the motor retention pieces 2c and 2d in the axial direction and by the flat part 2a and constricted part A in the circumferential direction. Then, the eccentric weights 10a and 10b are attached to the rotation shaft 11 protruding from the front and back ends of the holder 2 to obtain a vibration motor unit as shown in FIG. 4. Here, the fixing of the holder to the vibration motor body 1 can be enhanced by applying an adhesive to the holder surface entirely or partially or by welding.

On the other hand, the circuit board 3 having the creamed solder layers 3a, 3b, 3c and 3d at specific positions is prepared (see FIG. 1).

Figure 5:
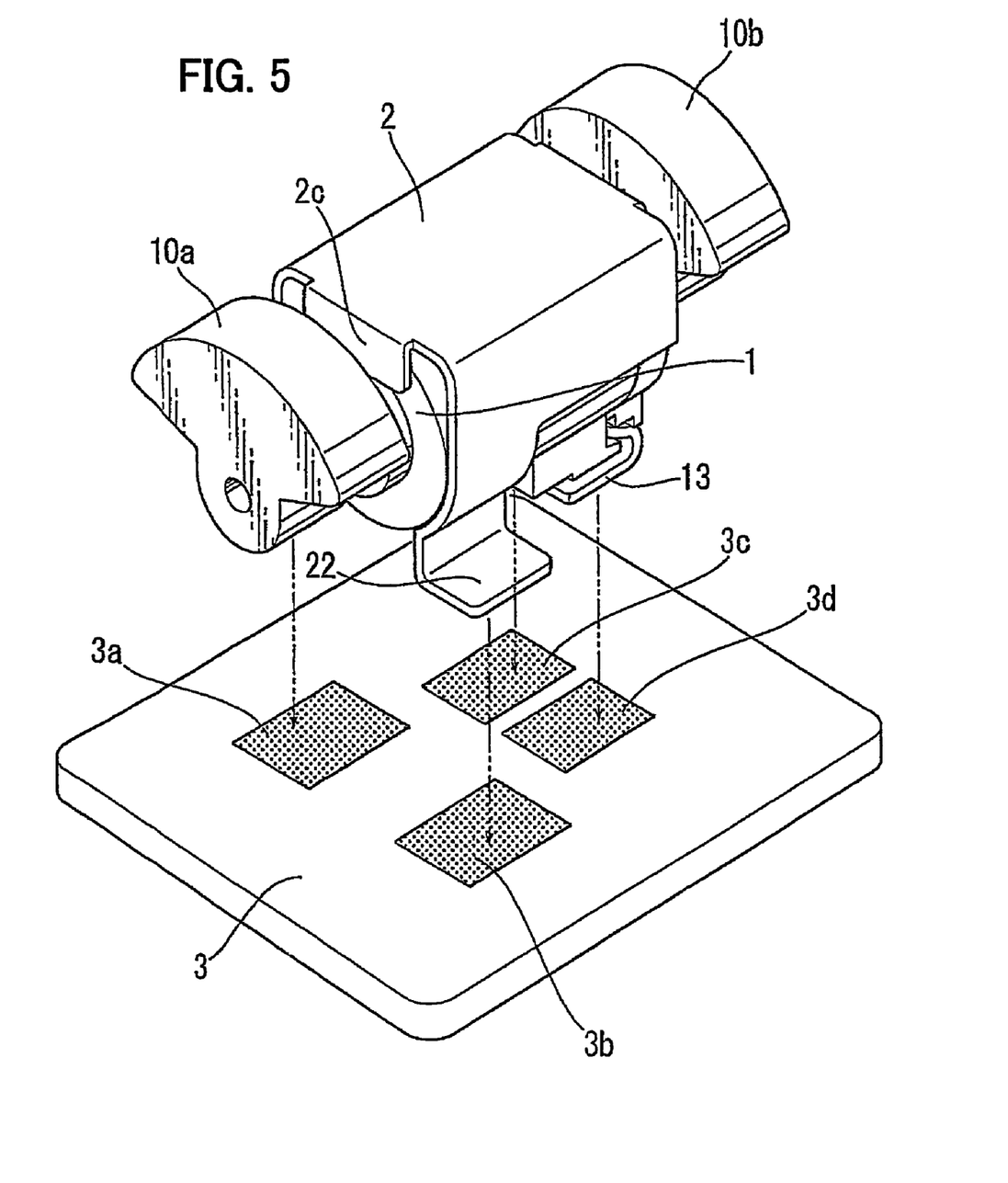
FIG. 5 is a perspective view showing the positional relationship between the vibration motor unit and the circuit board.

The vibration motor unit prepared as described above is placed on the circuit board 3 with the rotation shaft 11 parallel to the circuit board 3 as shown in FIG. 5. Here, the vibration motor unit is positioned on the circuit board 3 so that the protruding support legs 21 and 22 of the holder 2 are placed on the creamed solder layers 3a and 3b, respectively and the external terminals 13 and 13 (see FIG. 4) are placed on the solder layers 3c and 3d, respectively.

Figure 6:
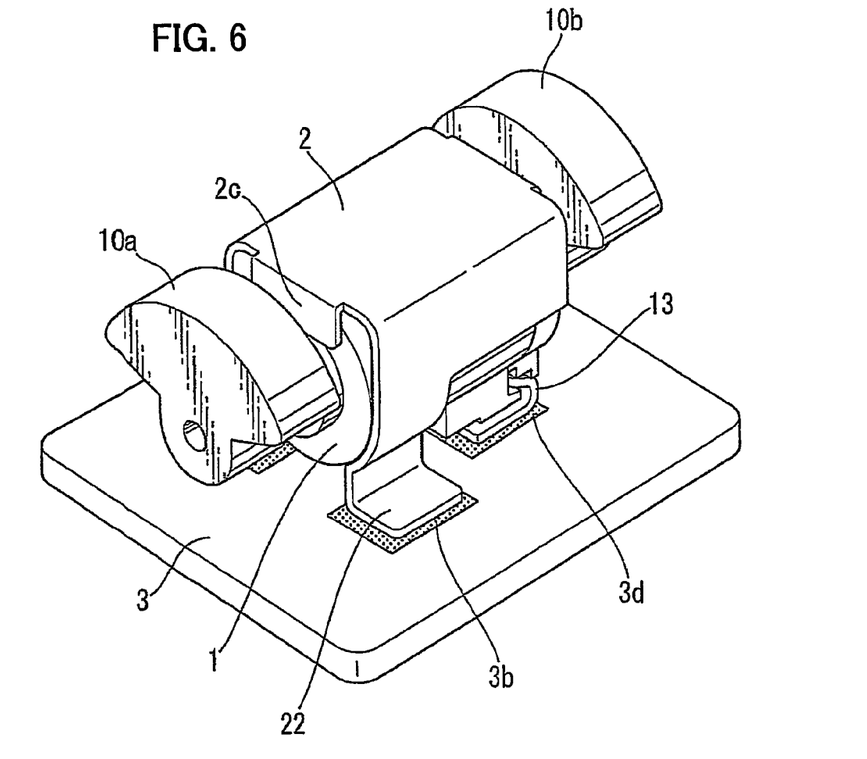
FIG. 6 is an illustration showing the vibration motor mounted on a circuit board.

The vibration motor unit with the support legs 21 and 22 and external terminals 13 of the holder 2 placed on the circuit board 3 as shown in FIG. 6 is conveyer-transferred into a reflow furnace (not shown) where the vibration motor unit is heated at stepwise elevated temperatures. The heating causes the creamed solder layers 3a, 3b, 3c and 3d to melt. Then, the mounted board is took out from the reflow furnace and cooled, whereby the vibration motor unit is secured to the circuit board 3.

Even if the vibration motor unit is subject to external vibration or extraordinary movement of the conveyer during the transfer, the vibration motor unit is stably supported by the horizontally protruding support legs 21 and 22 formed at the bottom of the holder 2 and therefore does not fall over.

Second Embodiment

A vibration motor provided with the holding structure according to another embodiment of the present invention will be described with reference to FIGS. 7 to 11.

Figure 7:
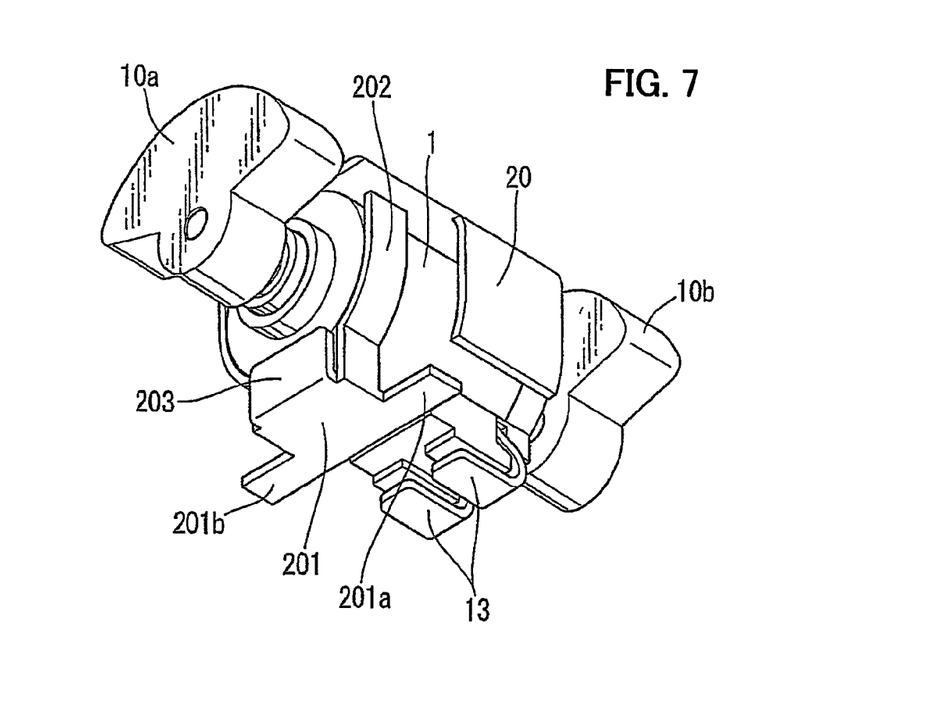
FIG. 7 is a perspective view of a vibration motor unit fabricated according to a second embodiment of the present invention.

FIG. 7 is a similar view to FIG. 4 and a perspective view of a vibration motor unit provided with a different holding structure seen from diagonally below. The same components as in the first embodiment are referred to by the same reference numerals in the figure and a description thereof will be omitted.

Figure 8:
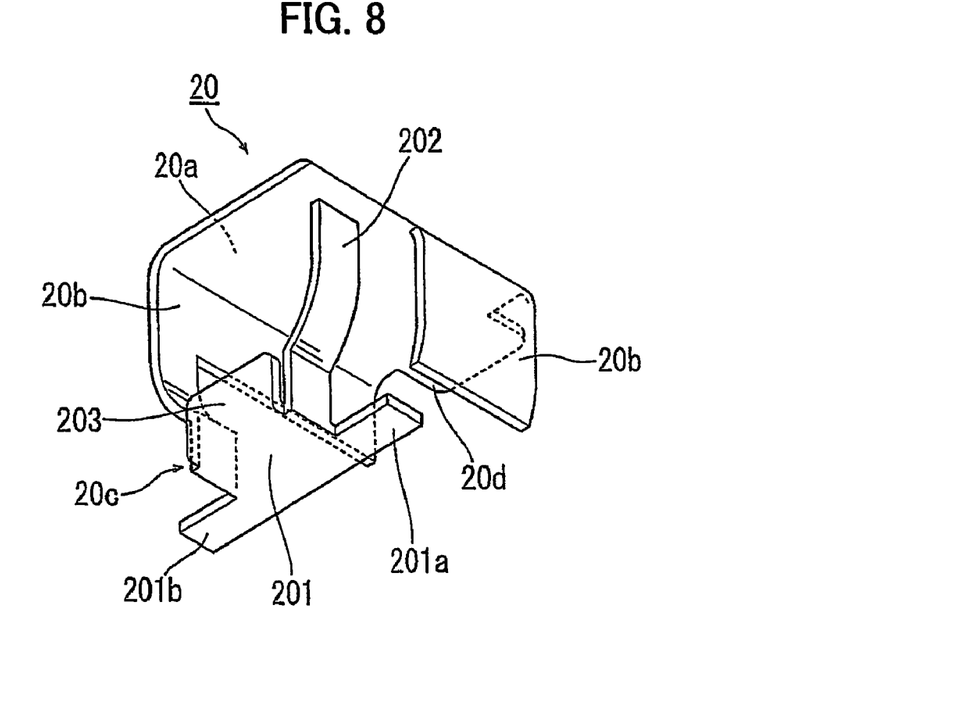
FIG. 8 is a perspective view of a holder shown in FIG. 7.

A holder 20 has a three-dimensional shape shown in FIG. 8, having a flat part 20a making contact with the top of the vibration motor body 1, side walls 20b turned downward from the flat part 20a and making contact with both peripheral sides of the motor body 1, and a support part 20c consisting of an extended section continued from the bottom of one side wall 20b at one longitudinal end (in the front on the left in the figure).

The support part 20c comprises a bottom 201, an upright piece 202 rising from a part of the bottom 201, and a motor retention piece 203. The bottom 201 has support legs 201a and 201b protruding in the direction orthogonal to the axis of the motor on both sides thereof.

Figure 9:
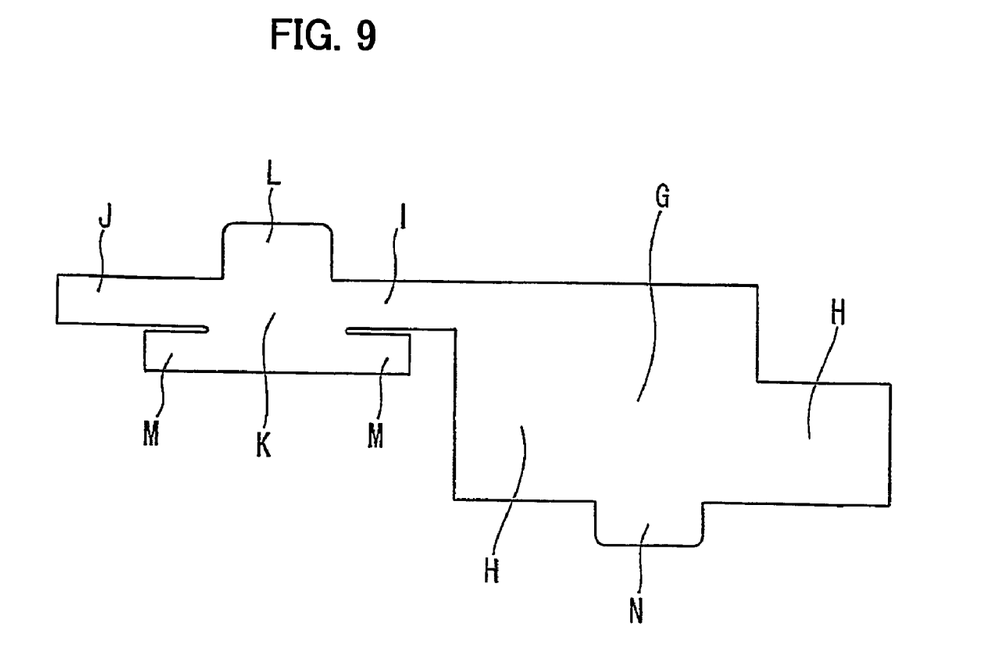
FIG. 9 is a plan view of a holder material.

As in the first embodiment, the holder 20 is formed by pressing a steel plate (such as a rolled carbon steel plate SPCC) having a thickness of 0.1 mm to 0.3 mm and plated for a good affinity to solder into a shape shown in FIG. 9, which is folded by a processing machine (not shown) to create a three-dimensional shape. The flat holder material shown in FIG. 9 and the processed three-dimensional holder 20 shown in FIG. 8 have the following relationship: a part G corresponds to the flat part 20a; parts H, the side walls 20b; a part I, a connection part between the side wall 20b and support part 20c; a part J, the upright piece 202; a part K, the bottom 201 of the support part 20c; a part L, the motor retention piece 203; parts M, the protruding support legs 201a and 201b; and a part N, the other motor retention piece 20d.

Figure 10:
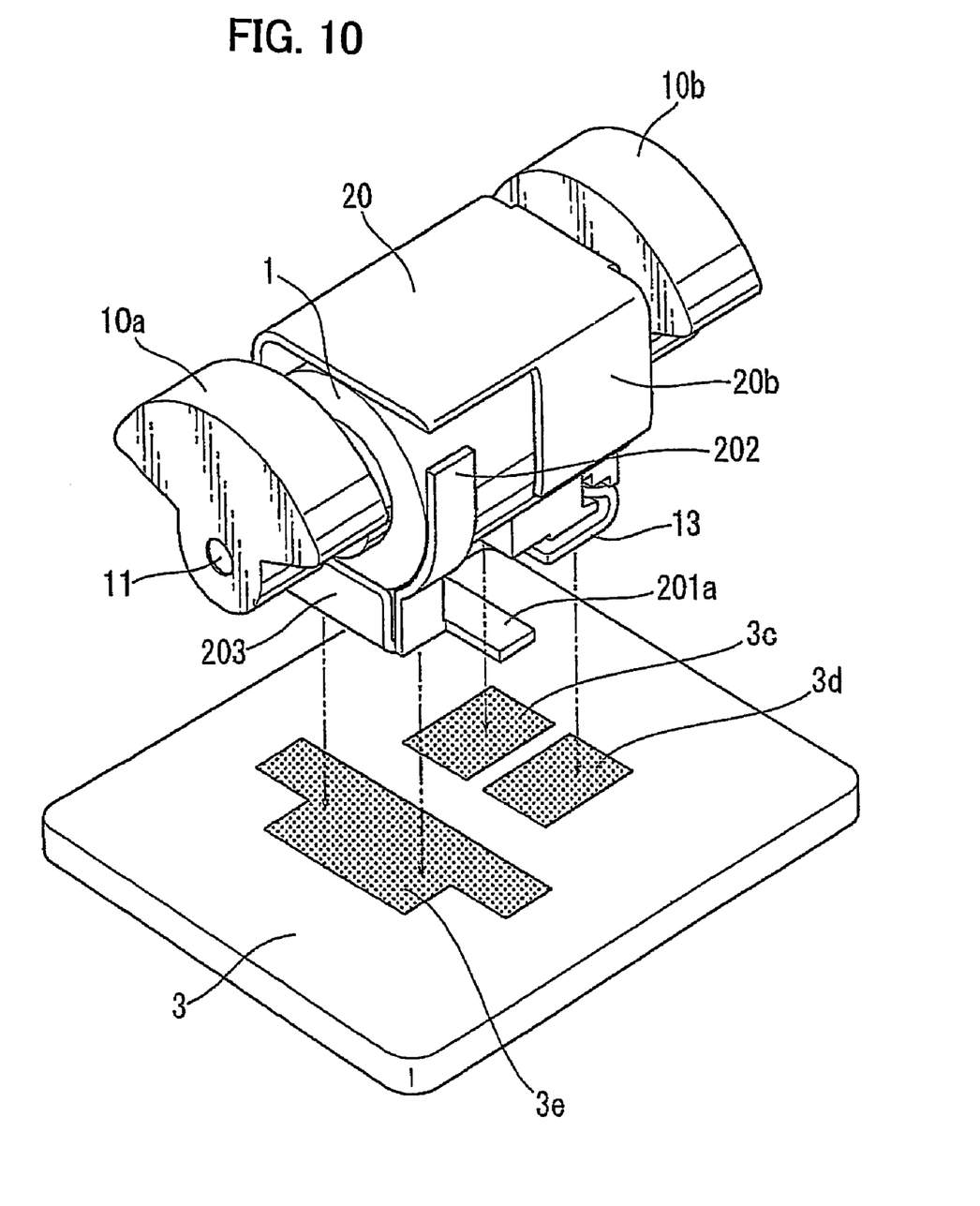
FIG. 10 is a perspective view showing the positional relationship between the vibration motor unit and the circuit board.

FIG. 10 is a similar view to FIG. 5. The circuit board 3 carries a desired print circuit (not shown) and creamed solder layers 3c, 3d and 3e at positions where no wiring for the printed circuit is provided. The position of the creamed solder layer 3e corresponds to the position of the bottom 201 of the support part 20c of the holder 2 and the positions of the creamed solder layers 3c and 3d correspond to the positions of the external terminals 13.

The production process of the vibration motor unit of the second embodiment will be described hereafter.

The cylindrical vibration motor body 1 is fitted in the holder 20 processed into the three dimensional shape shown in FIG. 8 from the back on the right until the leading end of the vibration motor body 1 abuts against the retention piece 203 in the front of the holder 20. Then, the motor retention piece 20d on the other end is bent downward. Consequently, the vibration motor body 1 is enclosed in the holder 20 by the motor retention pieces 203 and 20d in the axial direction, by the flat part 20a and support part 20c in the vertical direction, and by both side walls 20b and upright piece 202 in the transverse direction. Then, the eccentric weights 10a and 10b are attached to the rotation shaft 11 protruding from the front and back ends to obtain a vibration motor unit as shown in FIG. 7. Here, the fixing of the holder to the vibration motor body 1 can be enhanced by applying an adhesive to the holder surface entirely or partially or by welding.

On the other hand, the circuit board 3 having the creamed solder layers 3c, 3d and 3e at specific positions is prepared (see FIG. 10).

The vibration motor unit prepared as described above is placed on the circuit board 3 with the rotation shaft parallel to the circuit board 3 as shown in FIG. 10. Here, the vibration motor unit is positioned on the circuit board 3 so that the bottom 201 of the support part 20c of the holder 20 is placed on the creamed solder layer 3e and the external terminals 13 and 13 (see FIG. 7) are placed on the creamed solder layers 3c and 3d.

Figure 11:
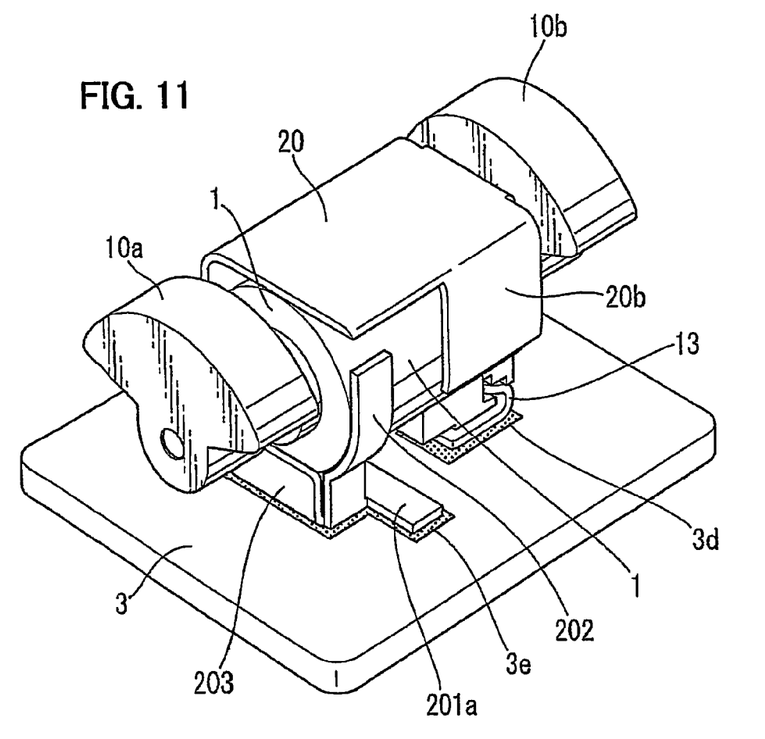
FIG. 11 is an illustration showing the vibration motor mounted on a circuit board.

The vibration motor unit with the bottom 201 of the support part 20c and external terminals 13 of the holder 20 placed on the circuit board 3 as shown in FIG. 11 is conveyer-transferred into a reflow furnace (not shown) where the vibration motor unit is heated at stepwise elevated temperatures. The heating causes the creamed solder layers 3c, 3d and 3e to melt. The mounted board is took out from the reflow furnace and cooled, whereby the vibration motor unit is secured to the circuit board 3.

Even if the vibration motor unit is subject to external vibration or extraordinary movement of the conveyer during the transfer, the vibration motor unit is stably supported by the bottom 201 of the support part 20c of the holder 20, particularly by the support legs 201a and 201b horizontally protruding in the direction orthogonal to the axis of the motor, and therefore does not fall over.

Third Embodiment

A vibration motor provided with the holding structure according to a further embodiment of the present invention will be described hereafter with reference to FIGS. 12 to 16.

Figure 12:
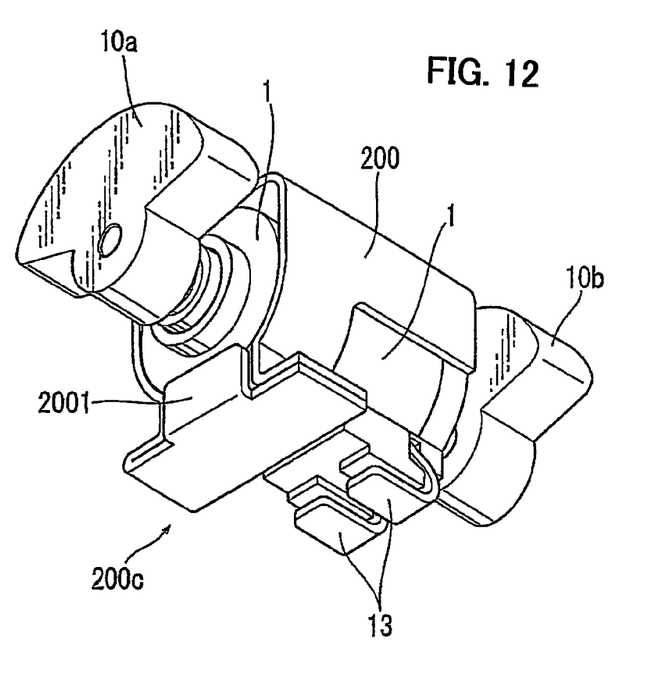
FIG. 12 is a perspective view of a vibration motor unit fabricated according to a third embodiment of the present invention.

FIG. 12 is a similar view to FIGS. 4 and 7 and a perspective view of a vibration motor unit provided with a further other holding structure seen from diagonally below. The same components as in the first and the second embodiments are referred to by the same reference numerals in the figure and a description thereof will be omitted.

Figure 13:
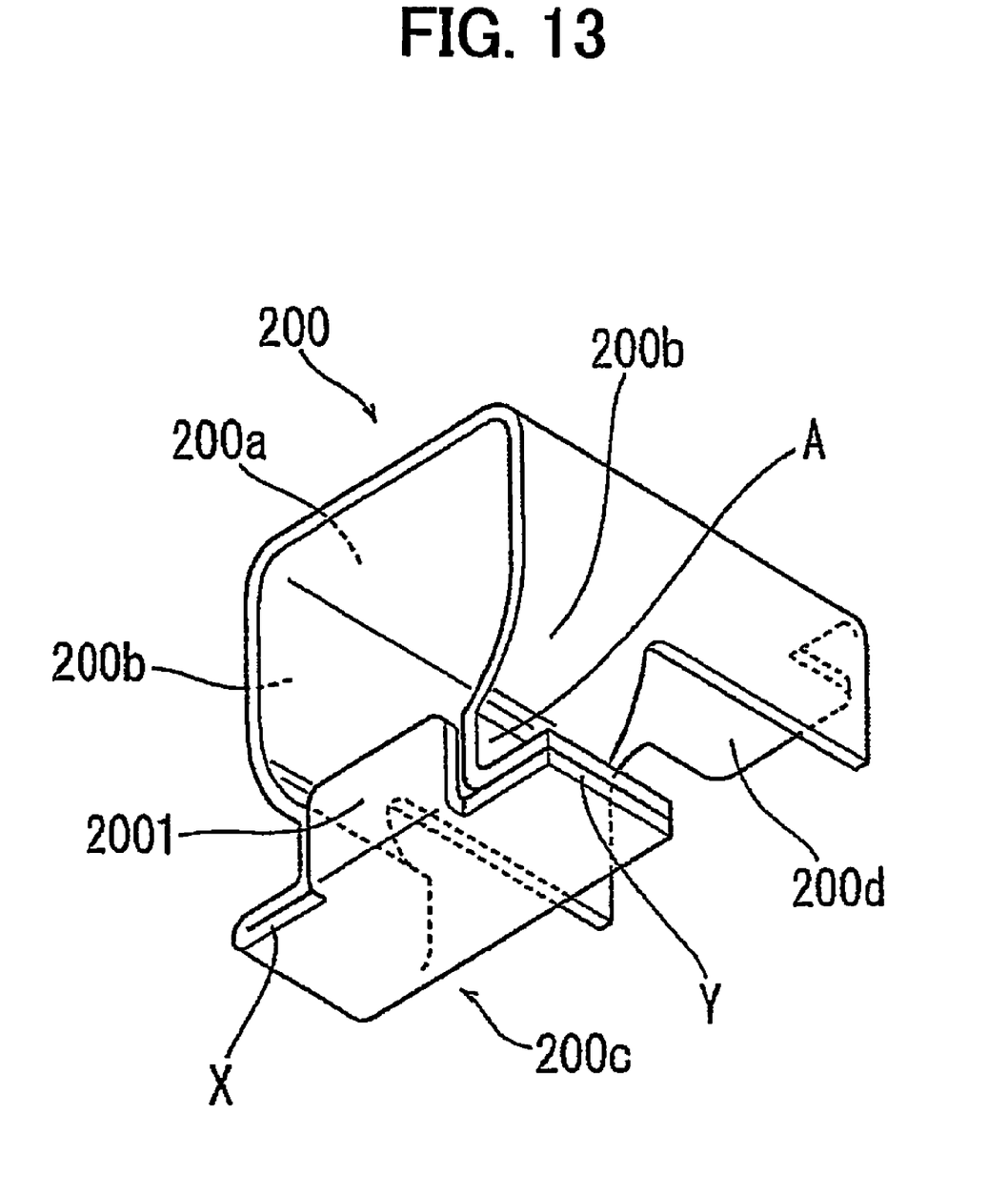
FIG. 13 is a perspective view of a holder shown in FIG. 12.

A holder 200 has a three-dimensional shape as shown in FIG. 13, having a flat part 200a making contact with the top of the vibration motor body 1 and side walls 200b turning downward from the flat part 200a on both sides to make contact with both peripheral sides of the vibration motor body 1. The side walls 200b form a constricted part A at one longitudinal end (in the front on the left in the figure). One side wall 200b (on the far side in the figure) continues beyond the constricted part to form a support leg 200c that is folded and horizontally protruding in a part X and then extending horizontally to the other sidewall 200b.

A part Y of the support leg 200c overlaps with the part of the other side support wall 200b (in the front in the figure) that is turned horizontally at the constricted part A at one longitudinal end (on the right in the figure). The support leg 200c is folded at the parts protruding on either side of the longitudinal direction for enhanced strength. The part Y can be bonded, welded, or caulked for further increased motor holding strength. The support leg 200c has a side edge raised to form a motor retention piece 2001.

Figure 14:
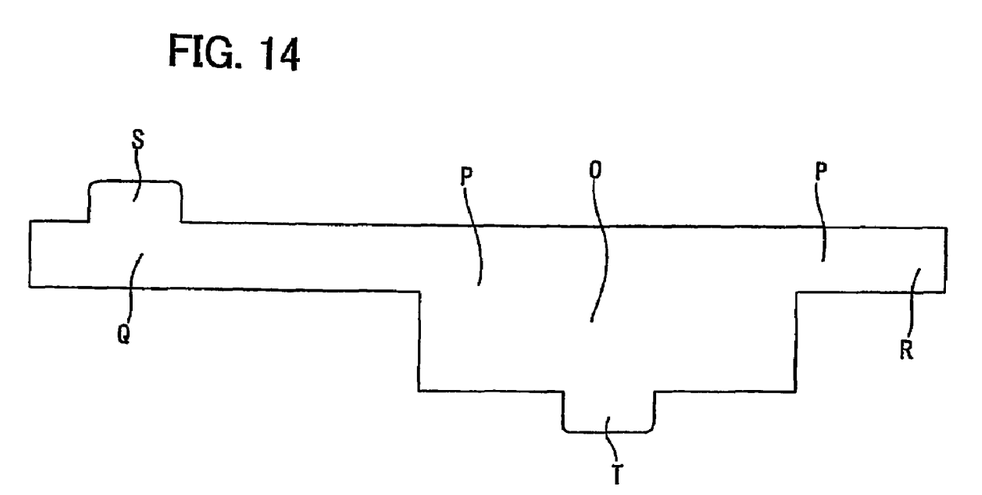
FIG. 14 is a plan view of a holder material.

As in the third embodiment described above, the holder 200 is formed by pressing a steel plate (such as a rolled carbon steel plate SPCC) plated for a good affinity to solder into a shape shown in FIG. 14, which is folded by a processing machine (not shown) to create a three-dimensional shape. The flat holder material shown in FIG. 14 and the processed three-dimensional holder 200 shown in FIG. 13 have the following relationship: a part O corresponds to the flat part

200a; parts P, the side walls 200b; a part Q, the bottom of the support leg 200c; a part R, the overlapping part Y of the support leg 200c; a part S, the motor retention piece 200l; a part T, another motor retention piece 200d.

Figure 15:
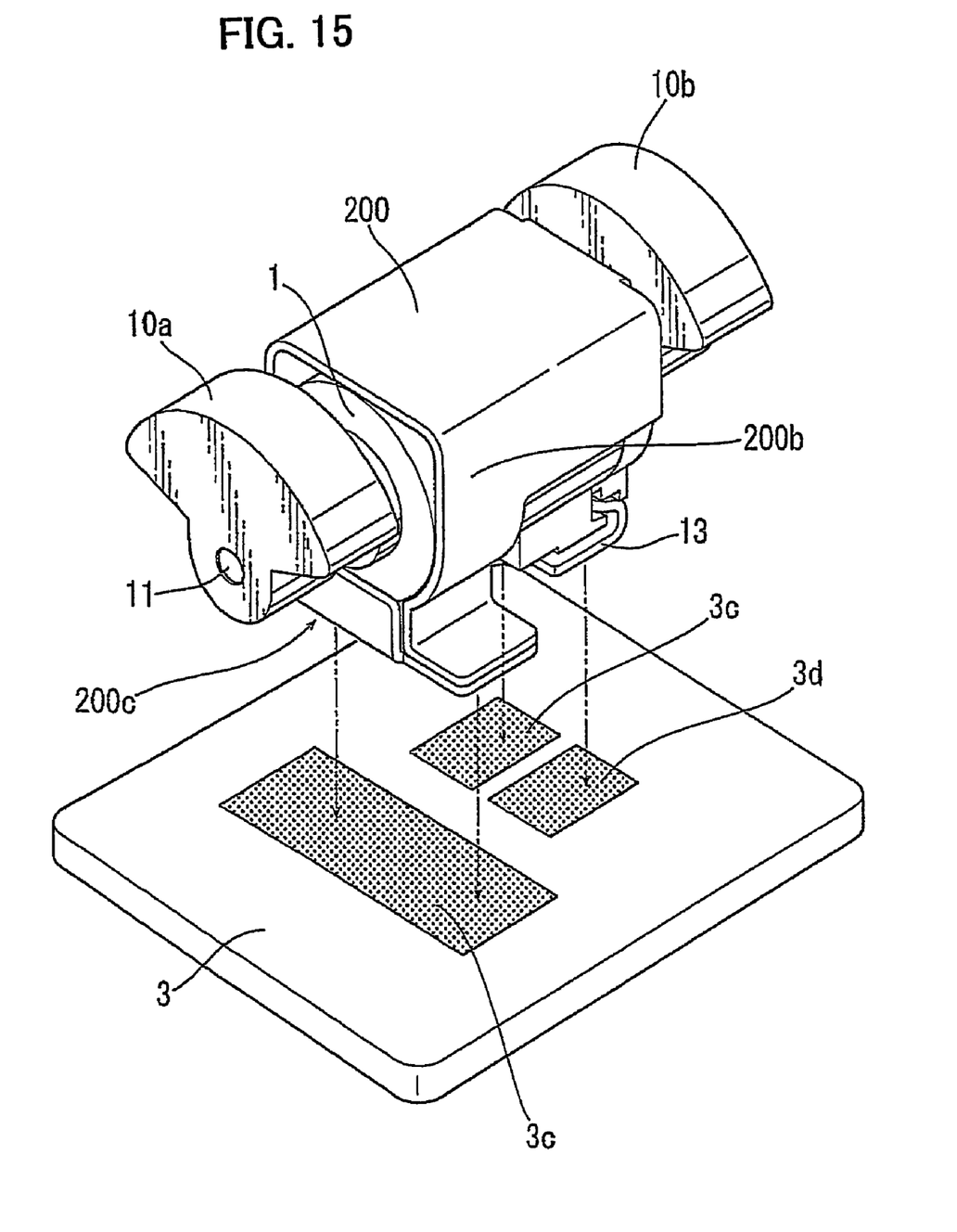
FIG. 15 is a perspective view showing the positional relationship between the vibration motor unit and the circuit board.

FIG. 15 is a similar view to FIG. 5. The circuit board 3 carries creamed solder layers 3c, 3d and 3e at positions where no wiring for the printed circuit is provided. The position of the creamed solder layer 3e corresponds to the position of the support leg 200c of the holder 200 and the positions of the creamed solder layers 3c and 3d correspond to the positions of the external terminals 13.

Figure 16:
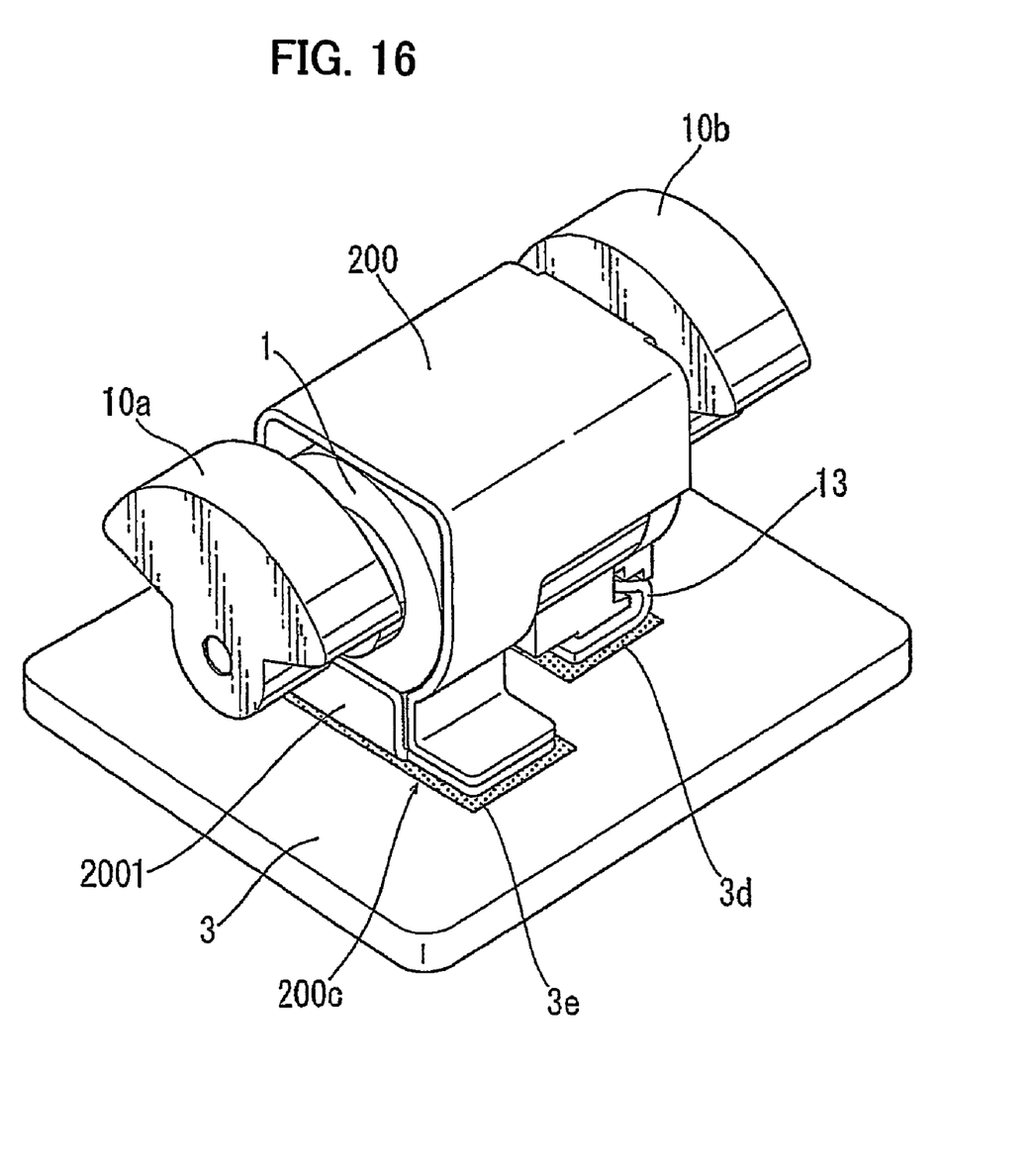
FIG. 16 is an illustration showing the vibration motor mounted on a circuit board.

A vibration motor unit of this embodiment is produced and mounted on a circuit board in a similar manner to the embodiments described above and, therefore, a description thereof will be omitted. FIG. 16 shows the vibration motor unit mounted on a circuit board.

Even if the vibration motor unit is subject to external vibration or extraordinary movement of the conveyer during the transfer, the vibration motor unit is stably supported by the support leg 200c at the bottom of the holder 200, particularly by both protruding parts and therefore does not fall over.

The vibration motor body has a cylindrical outer motor frame in the above embodiments. However, it can be rectangular. The holder can have the support legs at any positions based on the design.

What is claimed is:

1. A vibration motor holding structure for retaining a vibration motor having two eccentric weights each at rotation shaft ends and holding the vibration motor on a circuit board, the vibration motor holding structure comprising:

a top flat part for contacting with the top of the vibration motor;

a first side wall and a second side wall, each side wall extending downwardly in a U-shape from the flat part and contacting peripheral sides of the vibration motor body; and, a support leg for holding the vibration motor body on the circuit board, the support leg being formed from a lower portion of the first side wall and a lower portion of the second side wall, wherein the lower portion of the first side wall extends outwardly in a horizontal direction, and a lower portion of the second side wall extends outwardly in an opposing horizontal direction from the lower portion of the first side wall, and wherein the lower portion of the second side wall is folded into overlapping contact with the horizontal lower portion of the first side wall.

2. A method of manufacturing the vibration motor holding structure according to claim 1 comprising the steps of:

punching out a steel plate by press working into a developed holder shape; and forming a shape retaining the vibration motor from the top to both sides of the vibration motor and the support legs by folding the steel plate at predetermined positions.

3. The vibration motor holding structure according to claim 1, wherein the support legs are secured to the circuit board by reflow soldering.

4. The vibration motor holding structure according to claim 1, wherein the vibration motor is employed for a portable communication device.

* * * * *